(12) United States Patent
Rogers et al.

(10) Patent No.: US 10,455,716 B2
(45) Date of Patent: Oct. 22, 2019

(54) ELECTRONIC DEVICES HAVING NANOPARTICLE PROTECTIVE COATINGS

(71) Applicant: Apple Inc., Cupertino, CA (US)

(72) Inventors: Matthew S. Rogers, San Jose, CA (US); Marta M. Giachino, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/987,823

(22) Filed: May 23, 2018

(65) Prior Publication Data

US 2019/0104625 A1 Apr. 4, 2019

Related U.S. Application Data

(60) Provisional application No. 62/565,340, filed on Sep. 29, 2017.

(51) Int. Cl.

| H05K 7/02 | (2006.01) |
|---|---|
| H05K 7/04 | (2006.01) |
| H05K 5/03 | (2006.01) |
| H05K 5/00 | (2006.01) |
| G02B 1/14 | (2015.01) |
| H04M 1/02 | (2006.01) |

(52) U.S. Cl.
CPC ............... H05K 5/03 (2013.01); G02B 1/14 (2015.01); H04M 1/0264 (2013.01); H05K 5/0017 (2013.01); H04M 1/0266 (2013.01)

(58) Field of Classification Search
CPC ..................................... H05K 5/0017

USPC .......................................... 361/728–730, 807
See application file for complete search history.

(56) References Cited

U.S. PATENT DOCUMENTS

| 5,401,532 A * | 3/1995 | Coughlan ............... B44F 1/063 427/199 |
|---|---|---|
| 9,605,118 B2 | 3/2017 | Ueki |
| 9,759,945 B2 | 9/2017 | Ishiguro et al. |
| 9,807,919 B2 * | 10/2017 | Kwong ............... H05K 9/0067 |
| 2006/0065989 A1 | 3/2006 | Druffel et al. |
| 2008/0198302 A1 * | 8/2008 | Cho .................... G02B 5/3058 349/96 |
| 2009/0022995 A1 * | 1/2009 | Graham ............... B82Y 30/00 428/409 |

(Continued)

*Primary Examiner* — Hung S. Bui
(74) *Attorney, Agent, or Firm* — Treyz Law Group, P.C.; G. Victor Treyz; David K. Cole (57) ABSTRACT

An electronic device may be provided with a housing, electrical components mounted in the housing, and optical components. A display may be mounted to the housing and may have an array of pixels overlapped by a transparent member serving as a display cover layer. Transparent members in openings in the housing may form optical component widows. A housing member or a transparent member serving as a display cover layer or optical component window may be provided with a protective coating. The protective coating may be formed on an outer surface of the housing member or transparent member. The protective coating may have a polymer binder with embedded particles. The embedded particles may be hard particles that provide the protective coating with enhanced scratch resistance. The protective coating may help enhance fracture resistance in a display cover layer or other coated member.

18 Claims, 5 Drawing Sheets

(56) References Cited

U.S. PATENT DOCUMENTS

| | | | |
|---|---|---|---|
| 2014/0377566 A1* | 12/2014 | Majumdar | C08G 18/3853 |
| | | | 428/424.6 |
| 2016/0057877 A1 | 2/2016 | Aurongzeb et al. | |
| 2016/0366777 A1* | 12/2016 | Rogers | C03C 17/007 |
| 2017/0217143 A1* | 8/2017 | Kim | B32B 7/12 |
| 2018/0219586 A1* | 8/2018 | Mao | H02J 50/10 |
| 2019/0049814 A1* | 2/2019 | Whitehead | G02F 1/167 |

* cited by examiner

ELECTRONIC DEVICES HAVING NANOPARTICLE PROTECTIVE COATINGS

This application claims the benefit of provisional patent application No. 62/565,340, filed Sep. 29, 2017, which is hereby incorporated by reference herein in its entirety.

FIELD

This relates generally to electronic devices, and, more particularly, to electronic devices having structures with coatings.

BACKGROUND

Electronic devices such as cellular telephones, computers, watches, and other devices contain housing structures and transparent members such as display cover layers and camera windows. Housing structures and transparent members may be prone to scratches and susceptible to fracturing in the event of a drop event. If care is not taken, scratches may degrade the clarity of transparent members and may create unsightly wear on housing structures. Fracturing may permanently damage structures such as display cover layers and camera widows.

SUMMARY

An electronic device may be provided with a housing, electrical components mounted in the housing, and optical components. A display may be mounted to the housing and may have an array of pixels overlapped by a transparent member such as a display cover layer. Transparent members in openings in the housing may form optical component widows.

A housing member or a transparent member serving as a display cover layer, optical component window, or other device structure may be provided with a protective coating. The protective coating may be formed on an outer surface of the housing member or transparent member. The protective coating may help enhance fracture resistance in a display cover layer or other coated member and may help enhance resistance to scratches.

The protective coating may have a polymer binder with embedded particles. The embedded particles may be hard particles that provide the protective coating with enhanced hardness. The hard particles may be hard optically clear particles or, in configurations in which the coated member is opaque, may be hard light-absorbing particles.

DETAILED DESCRIPTION

Electronic devices and other items may be provided with housing structures. For example, electrical components in an electronic device may be mounted within a housing formed from materials such as glass, polymer, metal, and/or other materials. Displays, cameras, and other optical components may include transparent members. For example, a display may have a transparent display cover layer. Optical component windows may be formed from portions of a transparent display cover layer and/or may be formed from transparent window structures mounted in an opening in a device housing.

To prevent damage to housing structures, transparent members associated with optical component windows and displays, and other device structures, protective coatings can be formed on these structures. The protective coatings may include a binder material such as polymer (sometimes referred to as a matrix or polymer matrix) and may include particles embedded within the binder. The particles may have high hardness to enhance the durability of the protective coatings.

Figure 1:
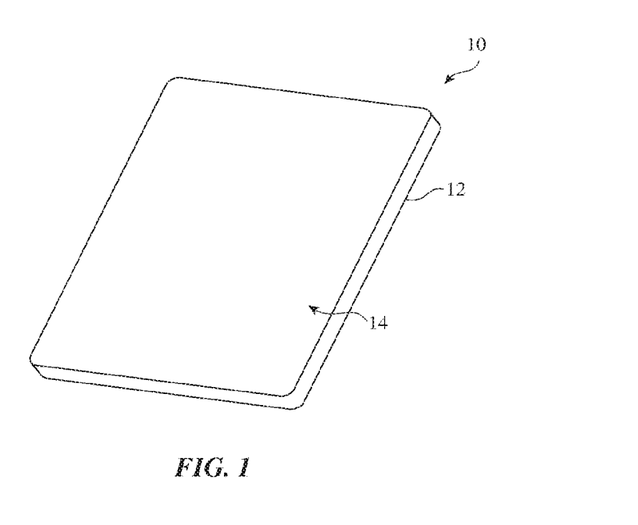
FIG. 1 is a perspective view of an illustrative electronic device in accordance with an embodiment.

An illustrative electronic device of the type that may be provided with protective coatings is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies.

Display 14 may include one or more layers of transparent material. For example, the outermost layer of display 14 (e.g., the outermost structural layer), which may sometimes be referred to as a display cover layer, may be formed from a hard transparent material to help protect display 14 from damage. The display cover layer and other transparent members in device 10 (e.g., windows for cameras and other optical components) may be formed from transparent materials such as glass, transparent crystalline material such as sapphire (sometimes referred to as corundum or crystalline aluminum oxide), clear polymer, transparent ceramic, and/or other transparent materials.

A display cover layer for display 14 may planar or curved and may have a rectangular outline, a circular outline, or outlines of other shapes. If desired, openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, or to form audio ports (e.g., openings for speakers and/or microphones).

Protective coatings may be formed on exterior surfaces of transparent members for display cover layers and/or windows, on housing members (e.g., rear housing structures, housing sidewalls, etc.), and/or other members in device 10. In some configurations, coatings may also be formed on one or more interior surfaces. On the exterior surfaces of structures in device 10, the protective coatings may help prevent damage to these structures (e.g., damage due to scratches, damage due to fracturing from drop events and other impacts, and/or other damage). If desired, functional coatings (e.g., antireflection coatings, mirror coatings, filter layers that block particular ranges of wavelengths, filter layers that impart desired colors, and/or other coatings) may be formed on top of a protective coating layer. Configurations for device 10 in which one or more layers of material are deposited on the interior surfaces of device 10 may also be used.

Figure 2:
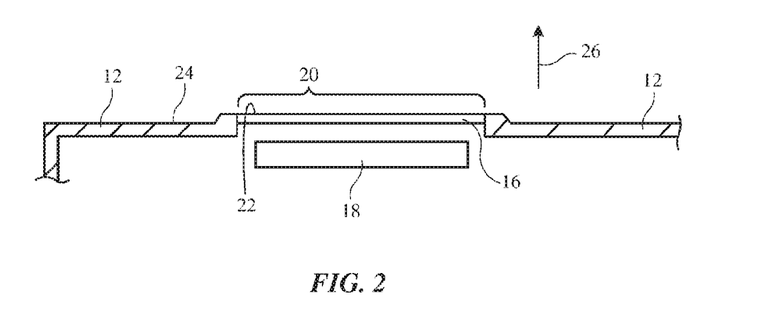
FIG. 2 is a cross-sectional side view of an illustrative electronic device optical component window such as a camera window in accordance with an embodiment.

A cross-sectional side view of an illustrative window in a portion of device 10 is shown in FIG. 2. As shown in FIG. 2, device 10 may have housing 12. Optical (light-based) component 18 may be mounted in alignment with opening 20 in housing 12. Opening 20 may be circular, may be rectangular, may have an oval shape, may have a triangular shape, may have other shapes with straight and/or curved edges, or may have other suitable shapes (outlines when viewed from above). Window member 16 may be mounted in opening 20 of housing 12 so that window member 16 overlaps component 18. A gasket, bezel, adhesive, screws, or other fastening mechanisms may be used in attaching window member 16 to housing 12. Surface 22 of window member 16 may lie flush with surface 24 of housing 12, may be recessed below surface 24, or may, as shown in FIG. 2, be proud of surface 24 (i.e., surface 22 may lie in a plane that is some distance away from surface 24 in direction 26). Surface 24 may form the rear face of housing 12 or other suitable portion of housing 12.

Optical component 18 may be based on one or more devices that emit visible and/or infrared light (e.g., a light-emitting diode, a laser, a lamp, etc.) and/or one or more devices that detect visible and/or infrared light (e.g., a visible or infrared image sensor that captures visible or infrared digital images through a lens, a proximity sensor detector that measures infrared light from an infrared emitter that has reflected off of external objects adjacent to device 10, an ambient light sensor that measures the intensity and/or color of ambient light, or other light producing and/or light measuring circuitry). With one illustrative configuration, window member 16 is a window member with a circular footprint, rectangular footprint, or oval footprint and optical component 18 includes a rectangular image sensor and a lens that is interposed between the window member and the rectangular image sensor. Other types of optical components 18 may be aligned with transparent members such as illustrative window member 16 of FIG. 2. The configuration of FIG. 2 is merely illustrative.

Figure 3:
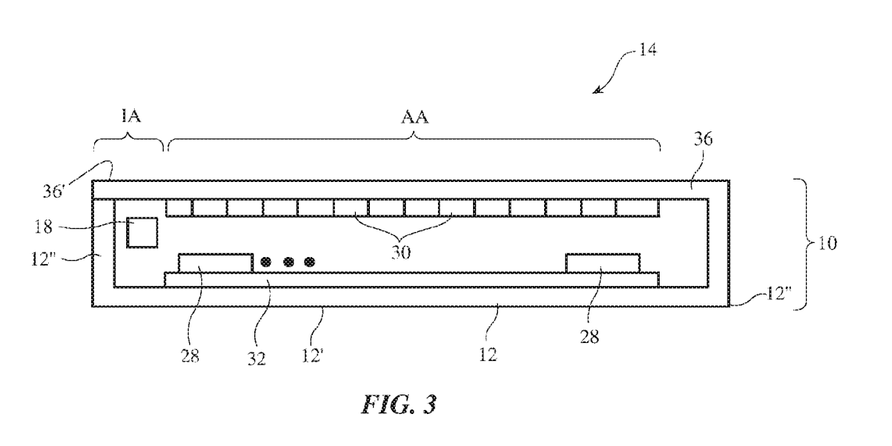
FIG. 3 is a cross-sectional side view of an illustrative electronic device in accordance with an embodiment.

FIG. 3 is a cross-sectional side view of device 10 showing how display 14 may include a transparent member such as display cover layer 36. Display cover layer 36 may be formed from glass, polymer, crystalline material such as sapphire, ceramic, and/or other materials. Display cover layer 36 may overlap an array of pixels 30 that are configured to display images in active area AA of display 14. In one or more regions of display cover layer 36 such as inactive area IA (e.g., an area of display 14 that is free of pixels and that does not display images), display cover layer 36 may have an optical component window that overlaps optical component 18. With one illustrative configuration, the optical component window of display cover layer 36 may have an area defined by an opening in an opaque masking layer on an inner surface of display cover layer 36. Optical component 18 may be aligned with the opening in the opaque masking layer. The opening may be free of added materials or may be filled with a coating. The coating in the opening may be formed from partially transparent ink, other partially transparent coating materials, and/or other coatings.

Optical component 18 of FIG. 3 is mounted within the interior of housing 12. Printed circuit boards and other substrates such as substrate 32 may also be mounted in the interior of housing 12. Substrate 32 may be populated with electrical components 28 (e.g., optical components 18, integrated circuits, sensors, communications circuitry such as cellular telephone transceiver circuitry, wireless local area network circuitry, vibrators, resistors, capacitors, inductors, and/or other circuits).

In arrangements of the type shown in FIG. 3, portions of device 10 are exposed to the exterior of device 10 such as front surface 36' of display cover layer 36, sidewall surfaces 12" of housing 12, and rear housing surface 12' of housing 12 (e.g., a planar housing member formed from metal, glass, polymer, ceramic, or other materials that serves as a rear wall for housing 12). Windows formed from structures such as window member 16 of FIG. 2 may also have surfaces that are exposed to the exterior of device 10 (e.g., window member surface 22). Coatings may be formed on these exterior surfaces and/or interior surfaces. For example, protective coatings formed from polymer with embedded hard particles may be formed on surfaces such as surface 22, surfaces 12", surfaces 12', and surface 36'.

Protective coatings for device 10 may be formed from particles embedded in polymer (e.g., sol-gel coatings). The particles may include hard particles (e.g., particles with a hardness of at least 8 Mohs, at least 8.5 Mohs, at least 9 Mohs, at least 9.5 Mohs, 10 Mohs, at least 7 Mohs, less than 9.5 Mohs, or other suitable hardness) to help enhance the hardness of the protective coating. Liquid polymer material with embedded hard particles can be applied to a surface of a transparent member, housing member, or other device structure to be protected. The liquid polymer material can then be cured to form a protective coating that includes the hard particles embedded in a solid polymer matrix.

The particles embedded in the coating may include hard transparent particles such as diamond particles, sapphire (aluminum oxide) particles (e.g., alundum or corundum), zirconia particles, quartz particles, titanium oxide particles, or other optically clear hard particles.

If desired, opaque structures in device 10 (e.g., opaque housing members) may be covered with the protective coating. In configurations in which the covered substrate is opaque, the protective coating may include opaque particles (e.g., silicon carbide particles, boron nitride particles, carbon nitride particles, tungsten carbide particles, and/or other hard light-absorbing particles). These particles may, if desired, be used in combination with transparent hard particles in the protective coating.

Figure 4:
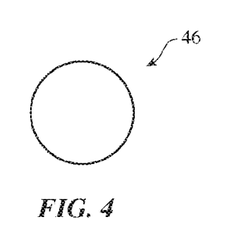
FIGS. 4 and 5 are cross-sectional side views of illustrative particles that may be incorporated in coating layers in accordance with embodiments.
Figure 5:
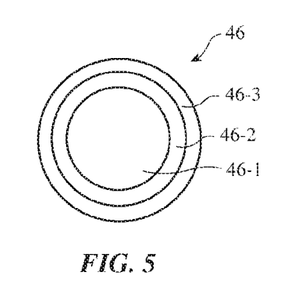

The particles that are incorporated into the protective coating may be formed of a single material as illustrated by particle 46 of FIG. 4 or may have one or more coating layers. As shown in FIG. 5, for example, particle 46 may have a core 46-1 formed from a hard material and may have one or more coating layers such as coating layers 46-2 and 46-3. With one illustrative configuration, core 46-1 may be formed from a hard material such as titanium dioxide or other hard material, coating 46-2 may be a stabilizing coating such as a stabilizing coating of silicon dioxide (silicon oxide) that helps prevent the titanium oxide of core 46-1 from reacting with polymer binder 44 under exposure to ultraviolet light, and coating 46-3 may be formed from a material such as aluminum oxide that provides particle 46 with a sufficiently high surface energy to allow particles such as particle 46 to disperse within the liquid polymer used in forming the coating.

Particles 46 may have any suitable size. For example, particles 46 may have diameters of 10 nm-2 microns, at least 10 nm, at least 20 nm, at least 40 nm, at least 80 nm, at least 200 nm, at least 300 nm, at least 500 nm, less than 2 microns, less than 1.6 microns, less than 1.2 microns, less than 800 nm, less than 600 nm, less than 400 nm, less than 300 nm, less than 150 nm, less than 75 nm, less than 50 nm, or other suitable size. Smaller particles (e.g., particles of less than 50 nm) may help minimize haze (e.g., light scattering through the protective coating may be minimized).

The thickness of the protective coatings formed using particles 46 may be 10 nm to 10 microns, 1 to 10 microns, at least 40 nm, at least 80 nm, at least 200 nm, at least 300 nm, at least 500 nm, at least 700 nm, at least 1 micron, at least 1.2 microns, at least 1.7 microns, at least 2 microns, at least 2.5 microns, at least 3 microns, at least 4 microns, at least 5 microns, less than 30 microns, less than 20 microns, less than 10 microns, less than 5 microns, less than 2 microns, less than 1.6 microns, less than 1.2 microns, less than 800 nm, less than 600 nm, less than 400 nm, less than 300 nm, less than 150 nm, or other suitable thickness. In some configurations, the protective coating may have a thickness (e.g., several microns or more or less than this thickness) that is sufficient to help the protective coating resist scratching. Coatings formed from polymer with embedded particles 46 can exhibit less stress buildup than physical vapor deposition coatings and can therefore help reduce the risk of fracture to a coated glass layer or other coated member during a drop event.

Figure 6:
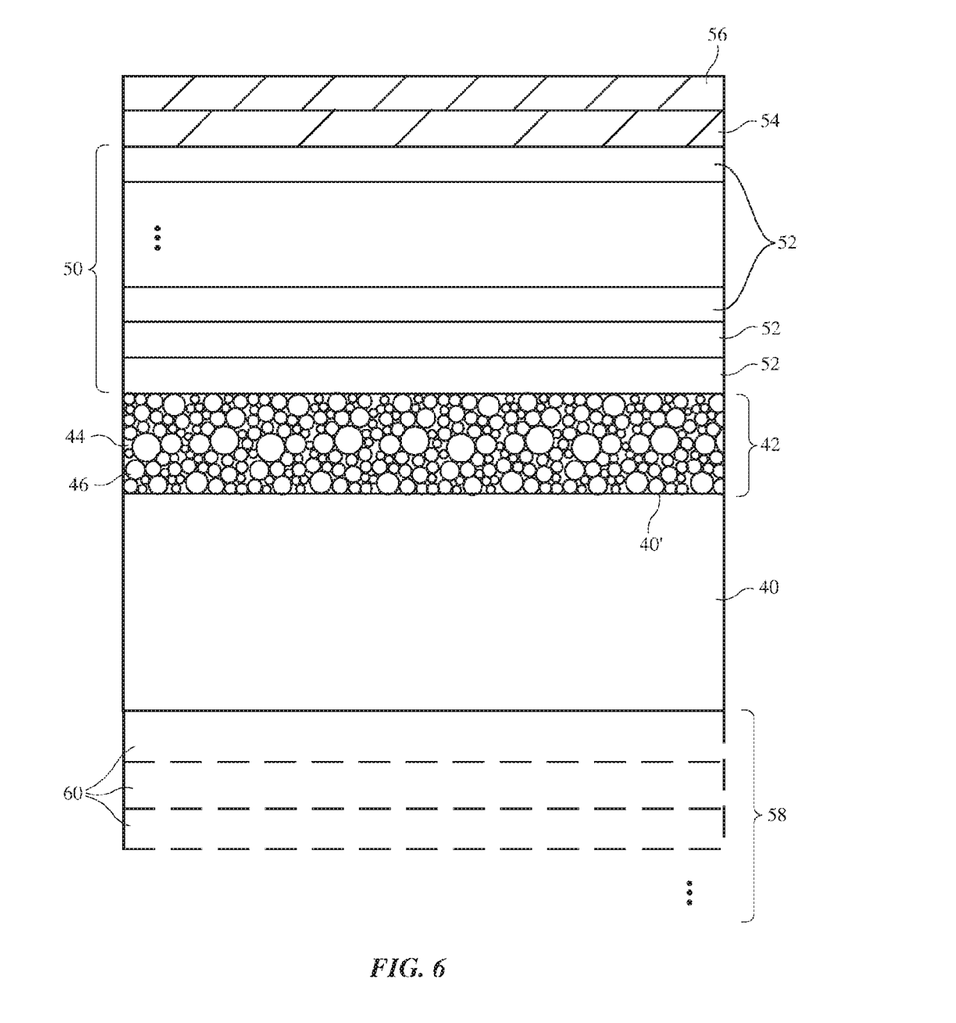
FIG. 6 is a cross-sectional side view of an illustrative member such as a housing wall or transparent member with coating layers in accordance with an embodiment.

A cross-sectional side view of an illustrative structure in device 10 with a protective coating is shown in FIG. 6. As shown in FIG. 6, member 40 may be provided with protective coating 42. Member 40 may be any suitable structure in device 10 to be protected with enhanced scratch resistance and/or enhanced resistance to fracturing (e.g., enhanced fracture resistance that helps device 10 sustain drop events and other undesired impacts without damage). For example, member 40 may be display cover layer 36, sidewall portions of housing 12, rear wall portions of housing 12, and/or other structures in housing 12, a portion of display cover layer 36 that forms an optical component window in inactive area IA of display 14, transparent member 16 of optical window 20 of FIG. 2, and/or other structure in device 10 to be protected.

Coating 42 may be formed on any suitable surface of member 40 (e.g., interior surfaces, exterior surfaces, etc.). As an example, coating 42 may be formed on outer surface 40' of member 40. Coating 42 may include particles 46 (e.g., hard particles or other suitable particles) in polymer binder 44. The liquid polymer that is used in forming polymer binder 44 may be acrylic, polyester, a liquid polymer precursor such as TEOS (tetraethyl orthosilicate), or other liquid polymer (polymer precursor).

If desired, optional additional layers such as layers 50, 54, and/or 56 may be formed on the outer surface of layer 42. Layer 50 may be a dielectric stack formed of multiple dielectric layers 52 (e.g., inorganic and/or organic dielectric layers with alternating refractive index). The dielectric stack of layer 50 may be configured to form an optical thin-film interference filter. Layer 50 may, for example, form a filter such as a visible-light-transmitting-and-infrared-light-blocking filter, an infrared-light-transmitting-and-visible-light-blocking filter, a filter having an appearance with a desired color, a bandpass filter, a band stop filter, a partially reflective mirror such as a mirror with a reflection of 30-70%, at least 40%, less than 50%, or other suitable reflectivity, a partially transmissive filter such as a neutral density filter with a transmission of 30-70%, at least 30%, less than 70%, or other suitable transmission, an antireflection coating (e.g., a coating that reduces light reflections to less than 1.5%, less than 1%, less than 0.5%, or other suitable amount), or other suitable filter. If desired, some or all of layer 50 may be formed from hard materials such as hard physical vapor deposition materials, diamond-like carbon, and/or other layers.

Optional coating layer 54 may be layer of silicon oxide or other suitable material that helps form an adhesion promotion layer. Layer 54 may be 5-10 nm thick, at least 4 nm thick, less than 15 nm thick, or other suitable thickness. Layer 56 may be an antismudge layer that is formed on layer 54. Antismudge layer 56 may be formed from a fluoropolymer and may have a thickness of at least 1 nm, at least 5 nm, less than 10 nm, less than 100 nm, or other suitable thickness.

Optional inner surface coating layer 58 may be formed on an opposing inner surface of member 40 (e.g., in configurations in which the external layers such as layer 42, layer 50, layer 54, and/or layer 56 are present or are omitted). Coating layer 58 may include a stack of multiple coatings 60. Coatings 60 may include dielectrics, semiconductors, metals, and/or other layers of material. As an example, some or all of coatings 60 may be configured to form a thin-film interference filter (e.g., a filter formed from a dielectric stack of dielectric layers of alternating refractive index). The thin-film interference filter on the inner surface of member 40 may, for example, include alternating organic layers (polymer layers) such as higher index layers that include index-of-refraction-enhancing particles such as silicon oxide particles and lower index layers that do not include silicon oxide particles. This type of arrangement or a thin-film filter dielectric stack formed of inorganic dielectric layers of alternating refractive index can be used to form an interior coating (e.g., an internal thin-film interference filter) with desired optical properties (partial reflection, high reflection, antireflection, color filtering, infrared-light blocking, visible-light blocking, a desired color appearance, etc.). If desired, coatings 60 may include ink layers (e.g., on the innermost surface of a dielectric stack forming a thin-film interference filter on the inner surface of member 40). Configurations in which layer(s) 60 and/or 52 include metal layers, semiconductor layers, ink layers, inorganic and/or organic dielectric layers, and/or other layers of material may also be used.

The foregoing is merely illustrative and various modifications can be made to the described embodiments. The foregoing embodiments may be implemented individually or in any combination.

What is claimed is:

1. An electronic device, comprising:
   a housing;
   an optical component in the housing;
   a transparent member that overlaps the optical component, wherein the transparent member is configured to pass light for the component; and
   a coating on the transparent member that has a polymer binder and embedded particles with a hardness of at least 7 Mohs, wherein each of the particles includes a core of a first material surrounded by a coating of a second material that is different than the first material.

2. The electronic device defined in claim 1 wherein the embedded particles comprise transparent particles.

3. The electronic device defined in claim 2 wherein the transparent particles comprise particles selected from the group consisting of: diamond particles, aluminum oxide particles, zirconia particles, and quartz particles.

4. The electronic device defined in claim 1 wherein the optical component comprises a camera.

5. The electronic device defined in claim 4 wherein the housing has an opening and wherein the transparent member forms an optical component window in the opening in the housing.

6. The electronic device defined in claim 1 further comprising:
   an array of pixels, wherein the transparent member comprises a display cover layer that overlaps the array of pixels.

7. The electronic device defined in claim 6 wherein the display cover layer has opposing inner and outer surfaces and wherein the coating is formed on the outer surface.

8. The electronic device defined in claim 7 wherein the display cover layer comprises a glass layer, the electronic device further comprising:
   a fluoropolymer layer that forms an antismudge coating for the display cover layer.

9. The electronic device defined in claim 8 further comprising:
   a silicon oxide layer interposed between the fluoropolymer layer and the display cover layer.

10. The electronic device defined in claim 8 further comprising:
    an antireflection coating between the fluoropolymer layer and the display cover layer.

11. The electronic device defined in claim 1 wherein the transparent member comprises a glass layer.

12. The electronic device defined in claim 1 wherein the particles each include a coating of a third material that surrounds the coating of the second material, wherein the third material is different than the second material.

13. The electronic device defined in claim 12 wherein the second material comprises silicon oxide and the third material comprises aluminum oxide.

14. The electronic device defined in claim 1 wherein the embedded particles have a hardness of at least 8.0 Mohs.

15. An electronic device, comprising:
    a housing;
    electrical components in the housing; and
    a coating on the housing having a polymer binder and particles embedded in the polymer binder that have a hardness of at least 8 Mohs, wherein the particles comprise opaque particles.

16. The electronic device defined in claim 15 wherein the opaque particles comprise particles selected from the group consisting of: silicon carbide particles, boron nitride particles, carbon nitride particles, and tungsten carbide particles.

17. An electronic device, comprising:
    pixels configured to display images;
    a display cover layer formed from a transparent glass member that overlaps the pixels; and
    a coating on an exterior surface of the transparent glass member that includes a polymer and particles embedded in the polymer, wherein the particles comprise particles selected from the group consisting of: diamond particles, aluminum oxide particles, zirconia particles, and quartz particles.

18. The electronic device defined in claim 17 wherein the coating has a thickness of 1 to 10 microns.

* * * * *